United States Patent
Medina

(10) Patent No.: US 7,852,064 B1
(45) Date of Patent: Dec. 14, 2010

(54) METER DEVICE AND METHOD OF TESTING A CUT NEUTRAL CONDUCTOR

(75) Inventor: Jose Medina, Ridgewood, NY (US)

(73) Assignee: Consolidated Edison Company of New York, Inc., New York, NY (US)

( * ) Notice: Subject to any disclaimer, the term of this patent is extended or adjusted under 35 U.S.C. 154(b) by 0 days.

(21) Appl. No.: 12/482,944

(22) Filed: Jun. 11, 2009

(51) Int. Cl.
*G01R 19/00* (2006.01)
(52) U.S. Cl. .................................. 324/108; 324/142
(58) Field of Classification Search ............ 324/158.1, 324/74, 122, 134, 164, 142, 117, 126, 127, 324/681, 682; 336/175–176
See application file for complete search history.

(56) References Cited

U.S. PATENT DOCUMENTS

| 4,271,390 A | | 6/1981 | Canu | |
|---|---|---|---|---|
| 5,617,020 A | * | 4/1997 | Campbell et al. | 324/142 |
| 7,274,187 B2 | * | 9/2007 | Loy | 324/142 |

FOREIGN PATENT DOCUMENTS

WO  2008061321 A1  5/2008

OTHER PUBLICATIONS

Declaration Under 37 CFR 1.56 by sole inventor Jose Medina, executed Jul. 15, 2009.

* cited by examiner

*Primary Examiner*—Minh N Tang
*Assistant Examiner*—Trung Q Nguyen
(74) *Attorney, Agent, or Firm*—Cantor Colburn LLP

(57) ABSTRACT

A meter device for checking the measurements of an electrical meter, such as that used by electrical utilities is provided. The meter device has a base with electrical phase conductors arranged to couple with a meter socket. A housing is attached to the base. Electrical connectors are arranged on the end of the phase conductors within the housing. The electrical connectors are arranged to couple with an electrical meter. One or more lead conductors is also provided. Each lead conductor has a first end coupled to the electrical connector and a second end coupled to the associated phase conductor. Each lead conductor includes a middle portion arranged outside of the housing.

18 Claims, 10 Drawing Sheets

US 7,852,064 B1

METER DEVICE AND METHOD OF TESTING A CUT NEUTRAL CONDUCTOR

BACKGROUND OF THE INVENTION

The subject matter disclosed herein relates to device for testing electrical service, and in particular to a device for electrical meters that allows the independent testing of electrical measurements made by the electrical meter.

Electrical meters are used to provide a measurement of the amount of electrical power consumed by a customer. Electrical meters are typically installed by a utility at a customers facility adjacent the location where the electrical power line enters the building. Electrical meters typically have an interface, such as an electronic display or a set of dials for example, that allows both the customer and the utility to review the amount of electrical power measured by the meter. The electrical meters are periodically (e.g. monthly) read by the utility to determine how much the customer should be billed. The meters may be read by sending personnel to each meter to record the measurements, or the data may be transmitted electronically to the utility. It should be appreciated that it is desirable that the electrical meter accurately measure the amount of electrical power consumed.

Periodically, it is desirable to test the measurements of the electrical meter to ensure that the measurements are accurate. Measurements by the meter could vary for a number of reasons, such as meter component failure, tampering or a broken or cut neutral conductor for example. To make these measurements, the utility typically needs access to the customer's circuit breaker panel. As a result, the testing needed to be scheduled when the customer was available to allow access to the facility. Often resulting in an inconvenience for the customer and the utility.

While existing devices and methods for checking the accuracy of electrical meters are suitable for their intended purposes, improvements may be made in allowing testing of the electrical meter location without entering a customer's facility.

BRIEF DESCRIPTION OF THE INVENTION

According to one aspect of the invention, a meter device is provided having a base. The base includes a first phase conductor and a second phase conductor extending therethrough. A housing is coupled to the base. A first stab is arranged in the housing and is electrically coupled to the first phase conductor. A second stab is arranged in the housing and is electrically coupled to the second phase conductor. A first lead conductor is electrically coupled between the first stab and the first phase conductor. A second lead conductor is electrically coupled between the second stab and the second phase conductor. A first insulation member covers the first lead conductor, the first insulation member having a first gap. A second insulation member covering the second lead conductor, the second insulation member having a second gap. A first cover is movably coupled to the first insulation member. A second cover is movably coupled to the second insulation member.

According to another aspect of the invention, a meter device is provided having a housing with a wall. A base is coupled to the housing. A first phase leg conductor is coupled to the base. A neutral conductor is coupled to the base. A first lead conductor having a first and second end is electrically coupled to the first phase leg conductor, the first lead conductor having a first loop portion extending through the wall. A first insulation member is disposed over the first lead conductor and extends from a first end to the first loop portion. A second insulation member is disposed over the first lead conductor and extends from a second end to the first loop portion, wherein the first insulation member and the second insulation member define first gap therebetween. A first cover is movably coupled to the first lead conductor. A neutral terminal is coupled to the wall, the neutral terminal being electrically coupled to the neutral conductor.

According to yet another aspect of the invention, a method of checking a neutral conductor on an electrical meter having at least one phase conductor is provided. The method includes the step of removing the electrical meter from a meter socket. A meter adapter is installed having at least one lead conductor electrically coupled to the at least one phase conductor and a neutral terminal. The electrical meter is installed on the meter adapter. An induction meter is coupled to the at least one lead conductor. A first measurement of electrical power is measured with the induction meter. The neutral terminal is coupled to an external neutral. A second measurement of electrical power is measured with the induction meter. A deviation is determined between the first measurement and the second measurement.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

Figure 1:
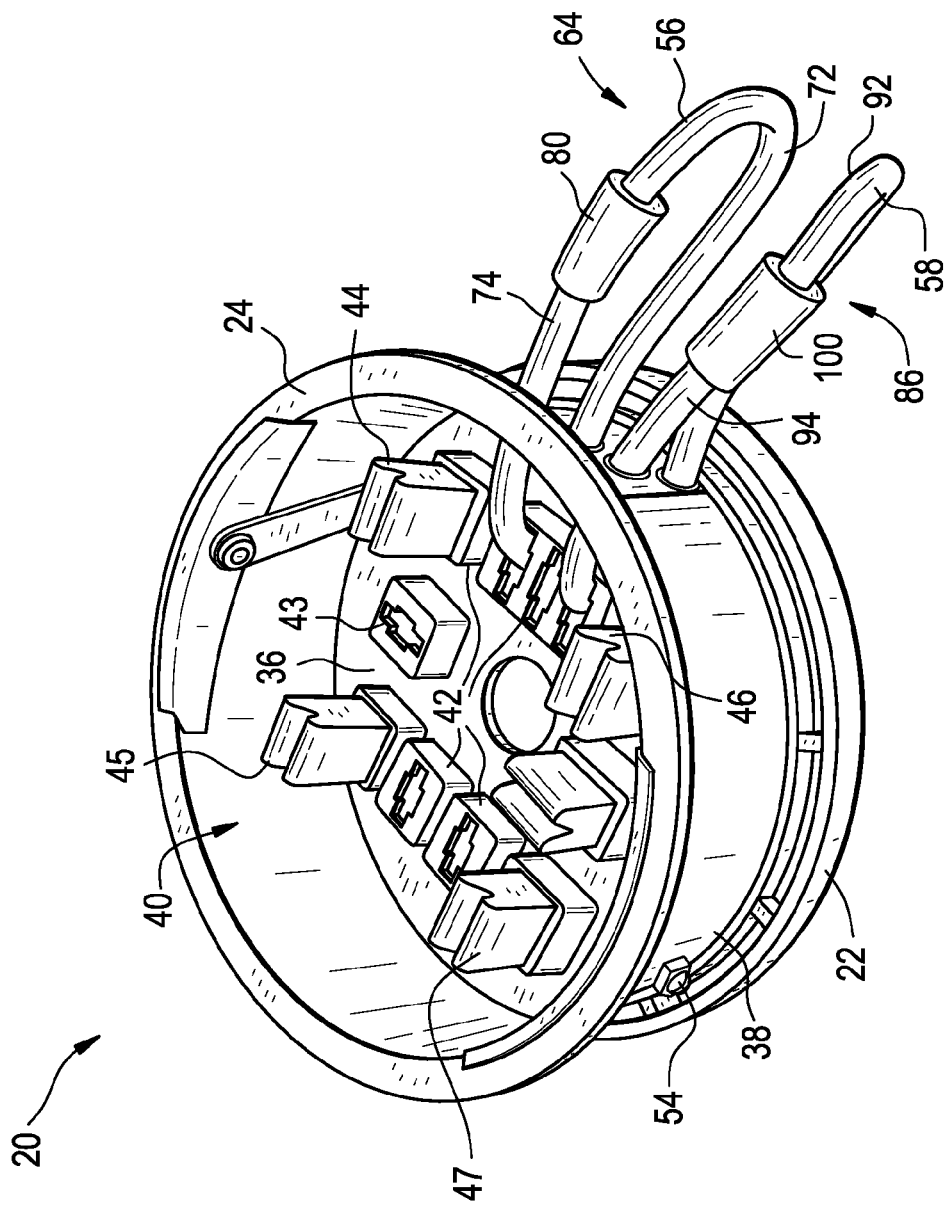
FIG. 1 is a first perspective view illustration of a meter device in accordance with an embodiment of the invention.
Figure 2:
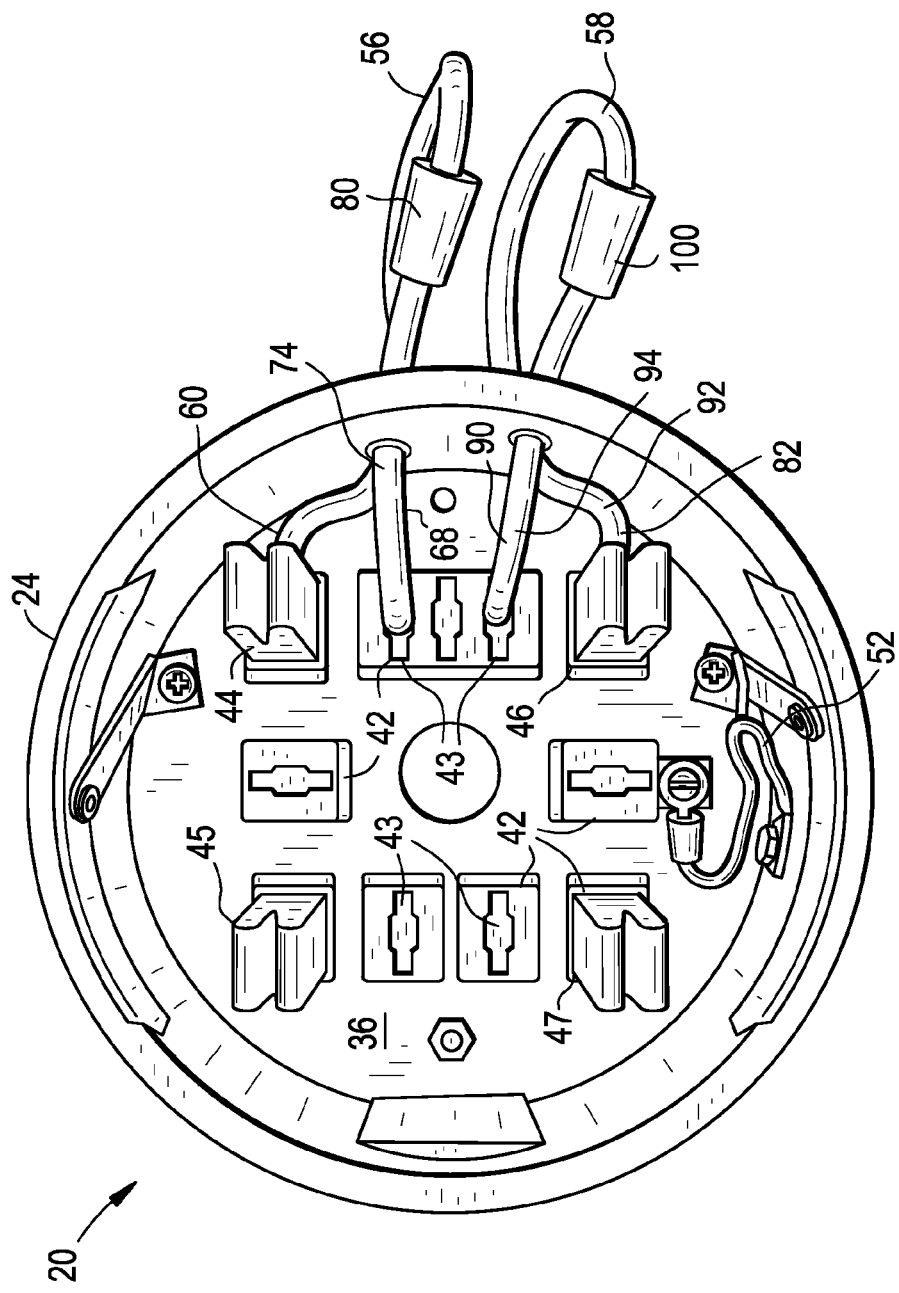
FIG. 2 is top plan view illustration of the meter device of FIG. 1.
Figure 3:
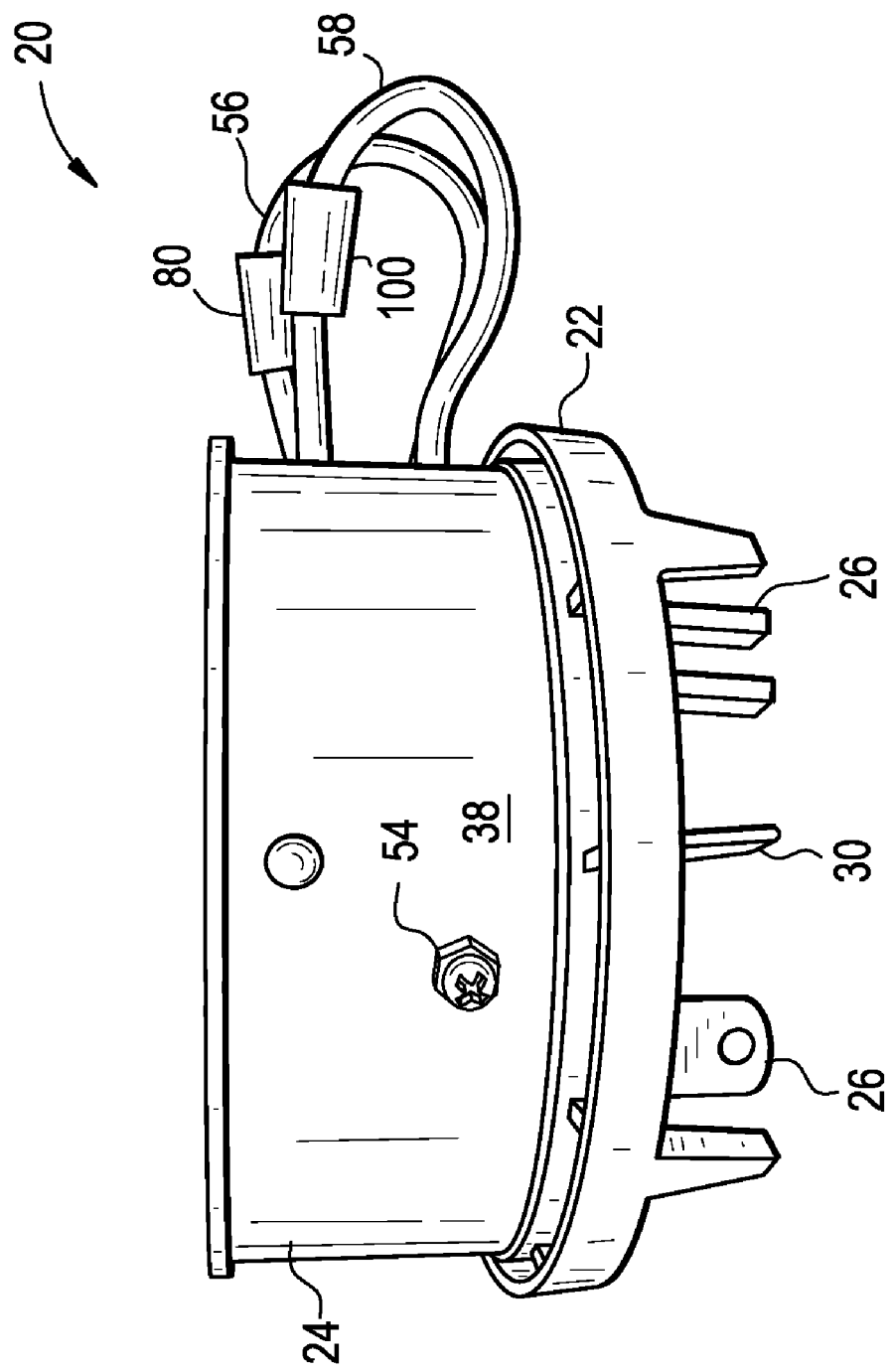
FIG. 3. is a first side view illustration of the meter device of FIG. 1.
Figure 4:
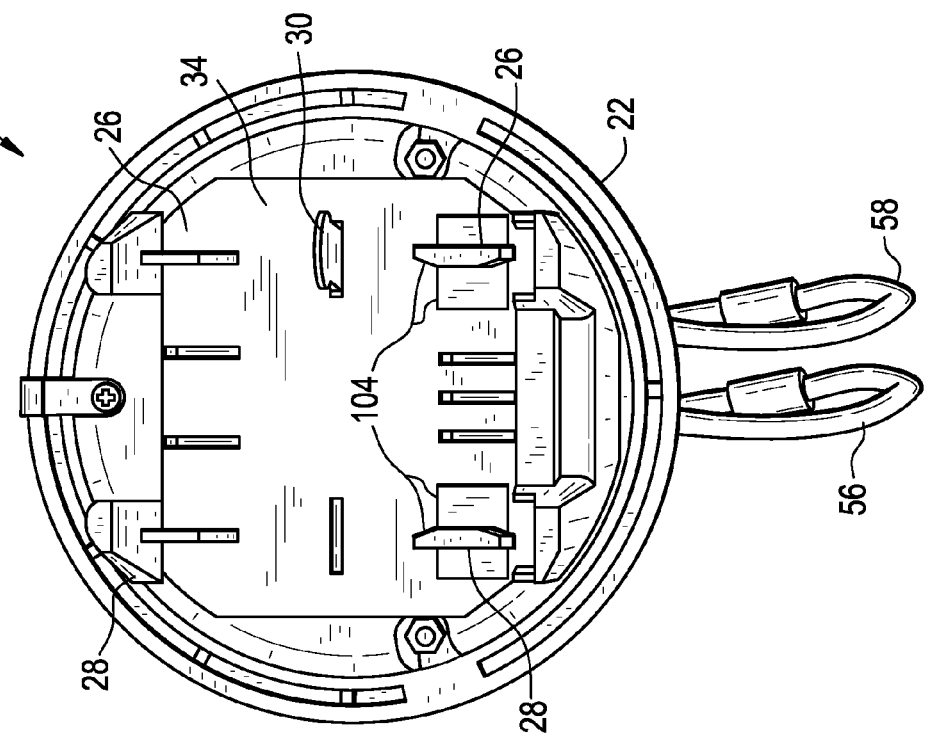
FIG. 4 is a bottom view illustration of the meter device of FIG. 1.
Figure 5:
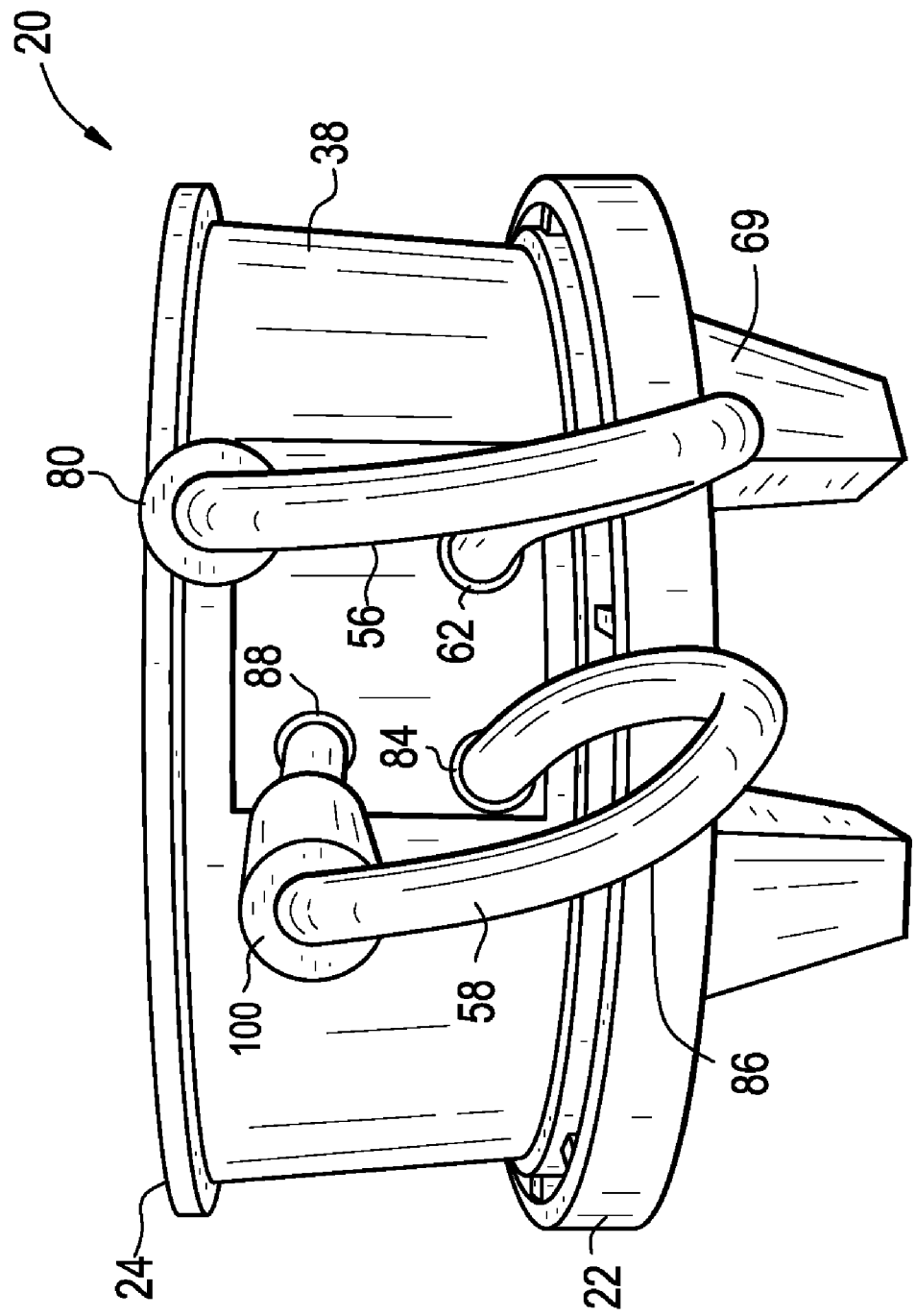
FIG. 5 is a second side view illustration of the meter device of FIG. 1.
Figure 6:
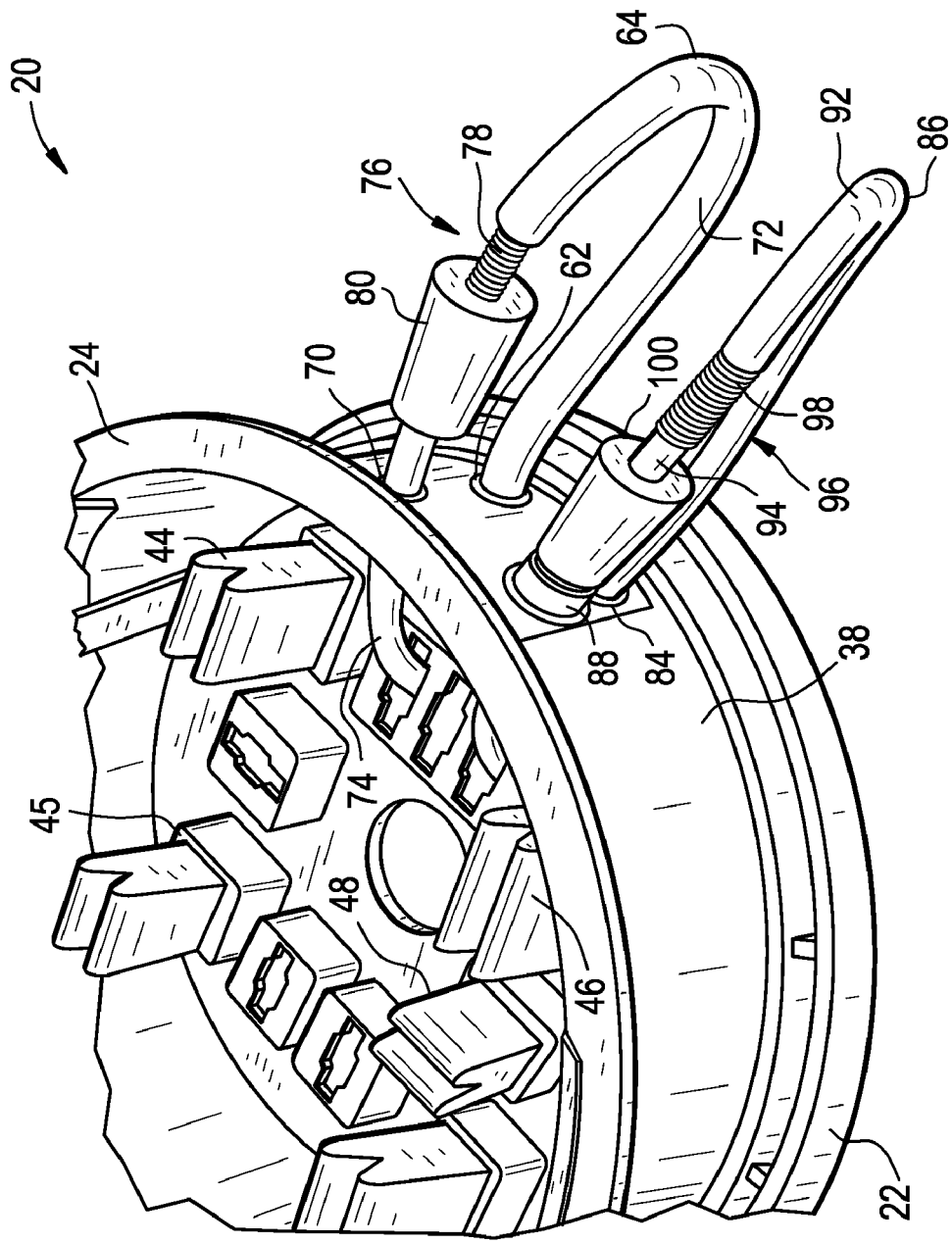
FIG. 6 is a second perspective view illustration of the meter device of FIG. 1 with covers arranged in a first position.

The detailed description explains embodiments of the invention, together with advantages and features, by way of example with reference to the drawings.

DETAILED DESCRIPTION OF THE INVENTION

An exemplary embodiment of a meter device 20 is illustrated in FIGS. 1-6. The meter device 20 includes a base 22 coupled to a housing 24. The base 22 includes a first pair of first phase conductors 26, a second pair of second phase conductors 28 and a neutral conductor 30. The conductors 26, 28, 30 extend from a bottom surface 34. In the exemplary embodiment, the base 22 and conductors 26, 28, 30 are generally adapted to interface with a standard electrical meter socket 32 (FIG. 7), such as those used by electrical utilities on residential and commercial buildings for example.

Figure 7:
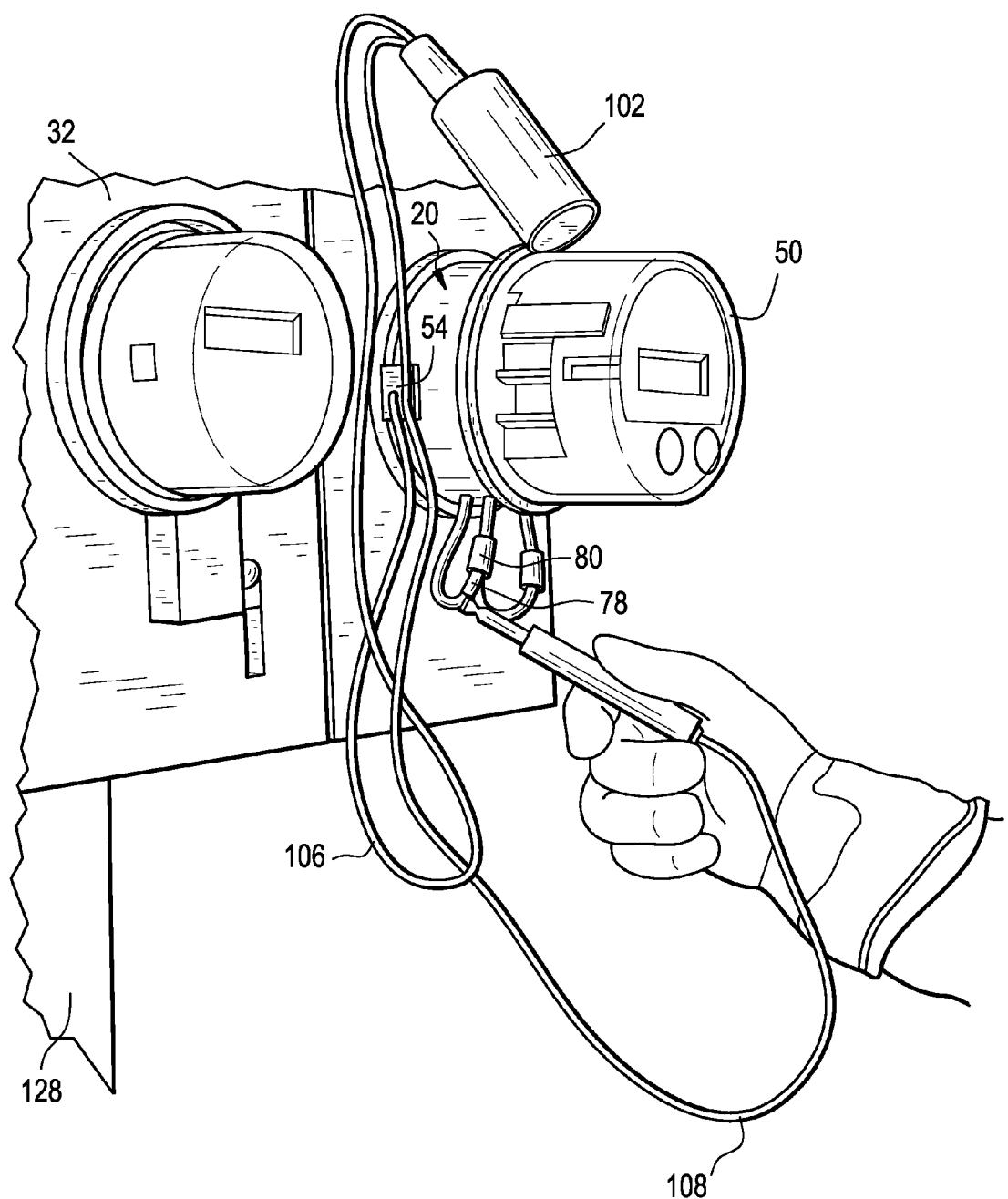
FIG. 7 is a perspective view illustration of the meter device of FIG. 1 installed with a load inducer.

The housing 24 includes a first wall 36, with a second wall 38 extending about its periphery. The walls 36, 38 define an interior portion 40. A plurality of standoffs 42 extends from the first wall 36 into the interior portion 40. Each of the standoffs 42 includes an opening 43 to allow wires and conductors to pass through. The conductors 26, 28, 30 extend through the standoffs 42 into the interior portion 40. The first phase conductors 26 are coupled to stabs 44, 45. The second phase conductors 28 are coupled to stabs 46, 47. The neutral conductor 30 is coupled to a stab 48. In the exemplary embodiment, each of the stabs 44, 45, 46, 47, 48 are adapted to interface with corresponding conductors (not shown) in an electrical meter 50 (FIG. 7). A wire 52 electrically connects the neutral stab 48 to a neutral terminal 54 mounted on the outer surface of the second wall 38.

The meter device 20 also includes a first lead conductor 56 and a second lead conductor 58. As will be discussed in more detail below, the first lead conductor 56 and second lead conductor 58 allow and operator to take measurements of electrical power with the electrical meter 50 installed. The first lead conductor 56 includes a first end 60 electrically coupled to the stab 44. The first lead conductor 56 extends from the first end 60 through an opening 62 in the second wall 38. The first lead conductor 56 then loops, forming a first middle portion 64 and reenters the interior portion 40 through a second opening 70 in second wall 38. A second end 68 of the first lead conductor 56 passes through an opening 43 in the standoffs 42 and connects to the first phase conductor 26 in the base 22 opposite the stab 44. A first insulation member 72 is disposed over the first lead conductor 56 adjacent the first end 60. The first insulation member 72 ends through the opening 62 and over a portion of the middle portion 64. A second insulation member 74 is disposed over the first lead conductor 56 adjacent the second end 68. The first and second insulation members 72, 74 are made from an electrically insulating material.

The first and second insulation members 72, 74 cooperate to define a gap 76 in the middle portion 64. In one embodiment, an electrically conductive first coil 78 is disposed in the gap 76. The coil 78 may be made from a suitable electrically conductive material such as copper for example. A first cover member 80 is disposed about the first insulation member 72. The first cover member 80 is moveable between a first position shown in FIG. 6 and a second position shown in FIG. 1. When arranged in the second position, the first cover member 80 substantially covers the gap 76. In one embodiment, the first cover member 80 is sized to cover the gap 76 and a portion of the first and second insulation members 72, 74 when in the second position. The first cover member 80 is made from an electrically insulating material, such as rubber for example.

The second lead conductor 58 is arranged in a substantially identical manner as the first lead conductor 56. The second lead conductor 58 includes a first end 82 electrically coupled to stab 46. The second lead conductor 58 extends therefrom through an opening 84 in second wall 38 forming a second middle portion 86. The second lead conductor 58 re-enters the interior portion 40 through an opening 88. A second end 90 extends through opening 43 in one of the standoffs 42 and is connected to the first phase conductor 26 opposite the stab 46. Similarly a third insulation member 92 is disposed over the second lead conductor 58 adjacent the first end 82 and a fourth insulation member 94 is disposed over the second lead conductor 58 adjacent the second end 90. The third and fourth insulation members 92, 94 cooperate to define a gap 96 in the middle portion 86. A second coil 98 is disposed in the gap 96 and a second cover member 100 is movably disposed over the third insulation member 92. Similar to the first cover member 80, the second cover member 100 is movable between a first position (FIG. 6) and a second position (FIG. 1). In one embodiment, the second cover member 100 is sized to span the gap 96 and a portion of the third insulation member 92 and the fourth insulation member 94 while in the second position.

It should be appreciated that the lead conductors 56, 58 are electrically coupled to the first phase conductor 26 and the second phase conductor 28 and that electrical current flowing through the phase conductors 26, 28 also flow through the respective lead conductors 56, 58. This provides advantages in measuring the individual phases separately. It should further be appreciated that while the embodiments described herein refer to a two-phase electrical meter, the claimed invention should not be so limited. A single-phase meter device 20 is also contemplated and would be substantially similar to that described herein however, only a single-phase conductor would be used with a single lead conductor for example.

Figure 8:
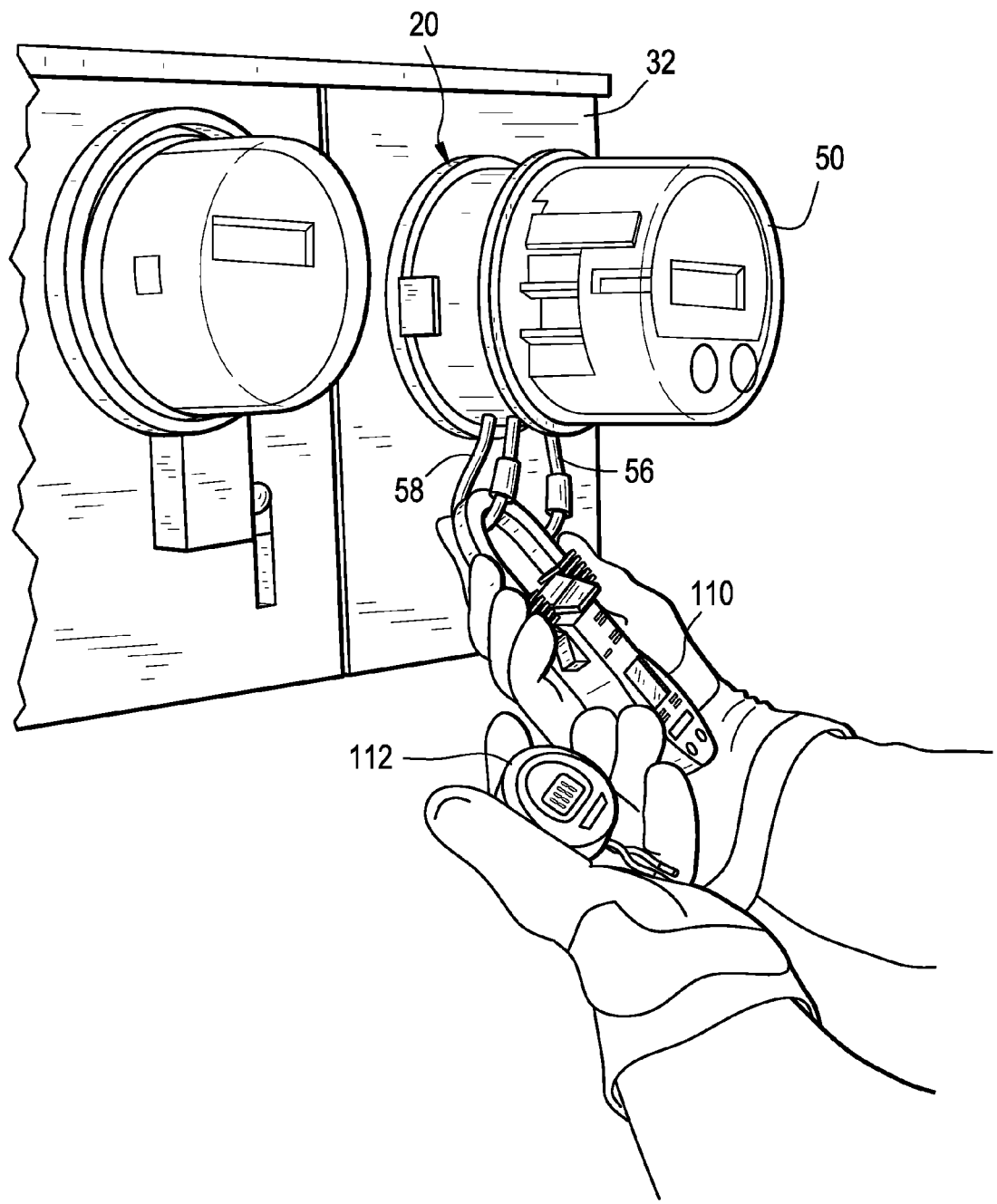
FIG. 8 is another perspective view illustration of the meter device of FIG. 1 with an induction meter attached.

Referring now to FIGS. 7-8, one method of operating the meter device 20 is illustrated. It is desirable to test the accuracy of the measurements made by the electrical meter 50 without entering the building or facility that the electrical meter 50 is connected. First, the electrical meter 50 is removed and the meter device 20 installed in the meter socket 32. The electrical meter 50 is then installed on the meter device 20. It should be appreciated that since the phase conductors 26, 28 provide a direct electrical connection from the electrical meter 50 to the meter socket 32, the electrical meter 50 may measure the flow of electrical current as if it were installed in the meter socket 32.

With the meter device 20 installed, a number of tests may be performed. In the embodiment illustrated in FIG. 7, a load inducer 102 includes a first cable 106 coupled to the neutral terminal 54 and a second cable 108 coupled to one of the coils 78, 98. To install the second cable 108, one of the cover members 80, 100 is moved from the second position to the first position to expose the underlying coil 78, 98. It should be appreciated that the cover member for the electrical phase not being tested remains in the second position covering the respective coil. In this embodiment, the electrical meter 50 may be electrically isolated from the building or load by placing insulators 104 (FIG. 4) over the phase conductors 26, 28. The load inducer 102 simulates a known quantity of load or flow of electrical current. With the load inducer 102 installed and operating, the operator can test the meter potentials and dial rotation. This provides the advantage of allowing the operator to validate the meter readings and determine if the electrical meter 50 has been tampered with or if there is a malfunction.

Other tests may also be performed. In the embodiment illustrated in FIG. 8, the electrical meter 50 is coupled to the customers load such that the electrical meter 50 is measuring the electrical power consumed. An induction meter 110 is coupled to one of the lead conductors 56, 58. Since the lead conductors 56, 58 are electrically coupled to the phase conductors 26, 28, the induction meter 110 can measure the electrical current flowing into the connected building. By measuring for a time period, such as with a stopwatch 112 for example, the operator may determine the electrical power consumed and compare this measurement with that measured by the electrical meter 50. Similar to the embodiment of FIG. 7, the performance of the electrical meter may be validated and tampering or malfunctions determined without requiring the operator to enter the building the electrical meter 50 is connect to. It should be appreciated that the testing could be performed on each electrical phase by connecting the induction meter 110 to each lead conductor 56, 58 sequentially.

Figure 9:
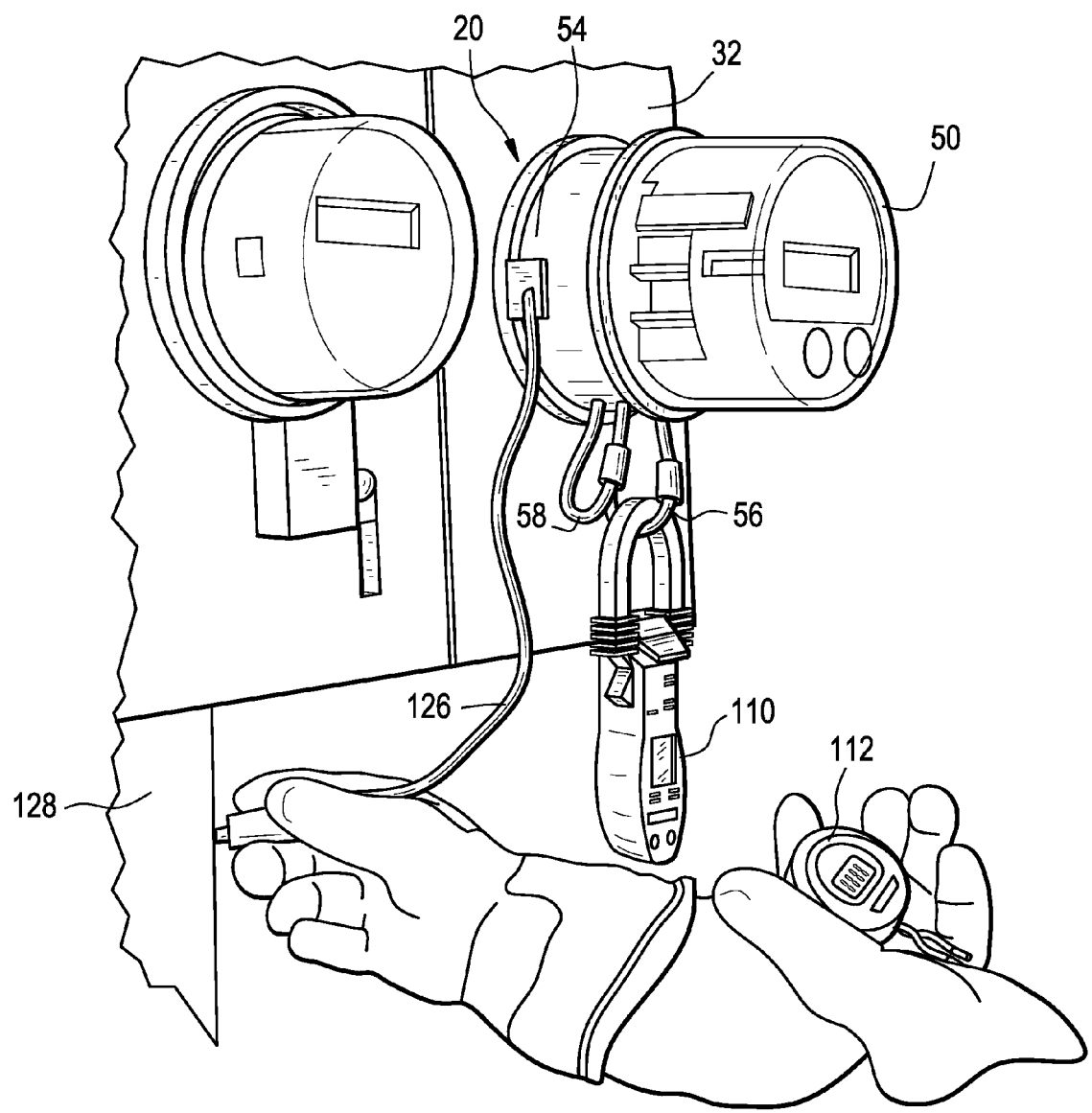
FIG. 9 is another perspective view illustration of the meter device of FIG. 1 with an external neutral attached; and, FIG. 10 is a flow diagram illustration of a method of detecting a severed neutral conductor.
Figure 10:
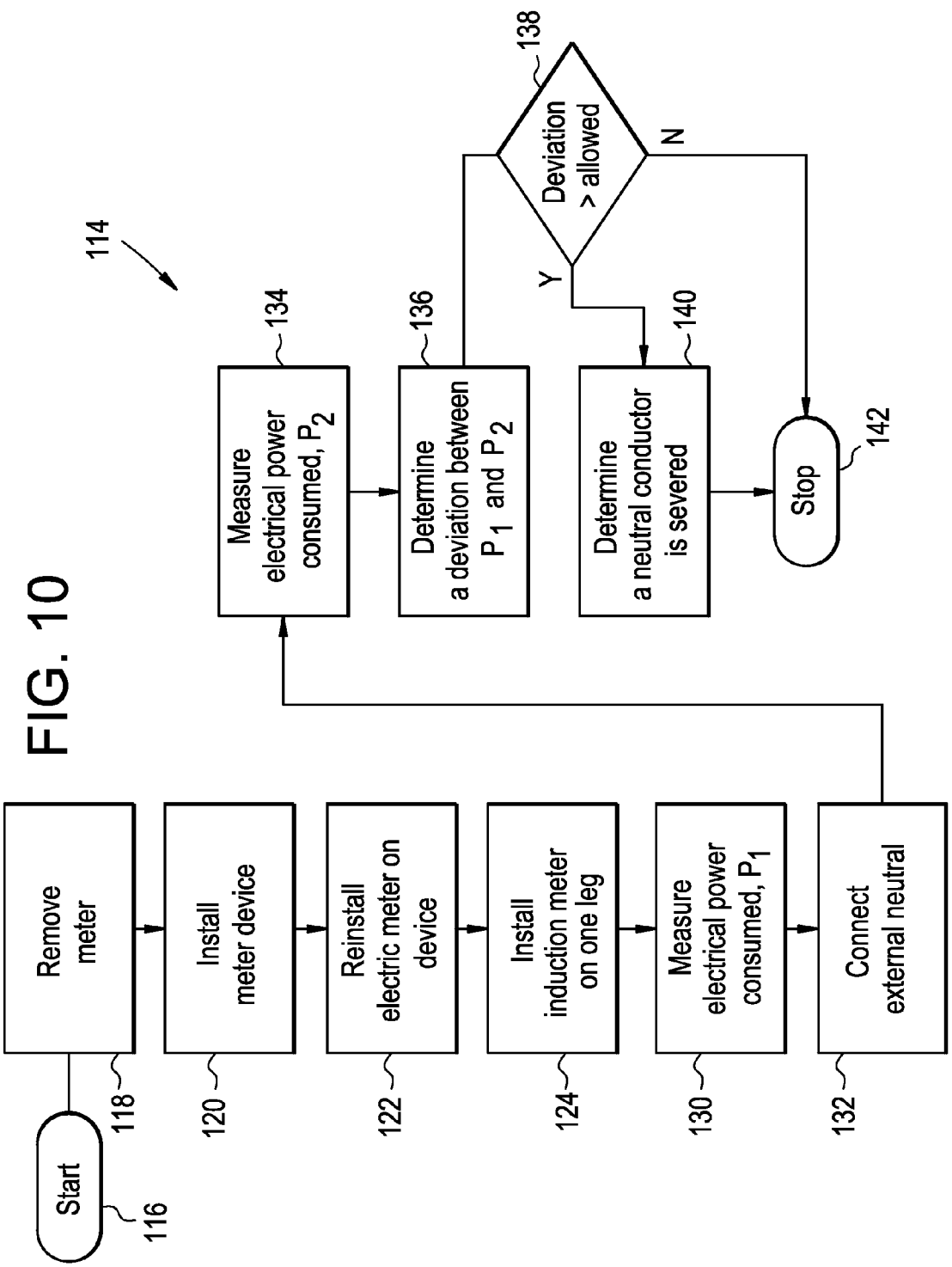

One other potential source of errors in the electrical meter 50 occurs when a neutral conductor has been severed or cut within the building to which the electrical meter 50 is connected. Referring now to FIGS. 9-10, a method 114 of detecting or validating a severed neutral conductor will be described. The method 114 starts in block 116 and proceeds to block 118 where the electrical meter 50 is removed. The meter device 20 is installed in block 120 and the electrical meter 50 installed on the meter device 20 in block 122 in a similar manner to that as described herein above.

An induction meter 110 is installed on one of the lead conductors 56, 58 in block 124. The electrical current is measured with the induction meter for a time period (as measured with stop watch 112 for example) in block 130. The amount of electrical power consumed may be determined from knowing the voltage, current and time. Next, in block 132, an external neutral conductor is connected by attaching an electrical cable 126 to the neutral terminal 54. The opposite end of the electrical cable 126 is placed in electrical contact with a known ground, such as a pipe 128 for example, to create an external neutral conductor.

With the external neutral in place, the operator once again measures the electrical current for a period of time in block 134. Method 114 then proceeds to block 136 where the deviation between the measurements with and without the external neutral connected is determined. In query block 138, it is determined whether the deviation or error in the measurements is beyond a threshold. If the deviation is greater than the threshold, then method 114 proceeds to block 140 where it is determined that the neutral conductor has been severed. After it has been determined that the neutral conductor was severed, or if query block 138 returns a negative (e.g. the measurements are similar), then the method 113 stops in block 142. The method 114 may be repeated for each electrical phase by moving the induction meter 110 from the first lead conductor 56 to the second lead conductor 58 and repeating steps described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A meter device comprising
   a base having a first phase conductor and a second phase conductor extending therethrough;
   a housing coupled to said base;
   a first stab arranged in said housing and electrically coupled to said first phase conductor;
   a second stab arranged in said housing and electrically coupled to said second phase conductor;
   a first lead conductor electrically coupled between said first stab and said first phase conductor;
   a second lead conductor electrically coupled between said second stab and said second phase conductor;
   a first insulation member covering said first lead conductor, said first insulation member having a first gap;
   a second insulation member covering said second lead conductor, said second insulation member having a second gap;
   a first cover movably coupled to said first insulation member; and,
   a second cover movably coupled to said second insulation member.

2. The meter device of claim 1 wherein said housing includes a wall defining an interior portion, said first stab and said second stab being positioned within said interior portion.

3. The meter device of claim 2 further comprising:
   a neutral conductor coupled to said base; and,
   a neutral terminal on an outer surface of said wall, said neutral terminal being electrically coupled to said neutral conductor.

4. The meter device of claim 3 wherein:
   said first lead conductor includes a first end coupled to said first stab and a second end coupled to said first phase conductor, wherein said first lead conductor extends through said wall forming a first middle portion positioned outside said wall, said first gap being positioned in said first middle portion; and,
   said second lead conductor includes a third end coupled to said second stab and a fourth end coupled to said second phase conductor, wherein said second lead conductor extends through said wall forming a second middle portion positioned outside said wall, said second gap being positioned in said second middle portion.

5. The meter device of claim 4 wherein said first cover is positioned on said first middle portion, said first cover being movable between a first position adjacent said first gap and a second position covering said first gap.

6. The meter device of claim 5 wherein said second cover is positioned on said second middle portion, said second cover being movable between a third position adjacent said second gap and a fourth position covering said second gap.

7. The meter device of claim 6 further comprising:
   a first coil disposed about said first lead conductor in said first gap; and,
   a second coil disposed about said second lead conductor in said second gap.

8. A meter device comprising:
   a housing having a wall;
   a base coupled to said housing;
   a first phase leg conductor coupled to said base;
   a neutral conductor coupled to said base;
   a first lead conductor having a first and second end electrically coupled to said first phase leg conductor, said first lead conductor having a first loop portion extending through said wall;
   a first insulation member disposed over said first lead conductor and extending from a first end to said first loop portion;
   a second insulation member disposed over said first lead conductor and extending from a second end to said first loop portion, wherein said first insulation member and said second insulation member define first gap therebetween;
   a first cover movably coupled to said first lead conductor; and,
   a neutral terminal coupled to said wall, said neutral terminal being electrically coupled to said neutral conductor.

9. The meter device of claim 8 further comprising:
   a second phase leg conductor coupled to said housing;

a second lead conductor having a third end and a fourth end electrically coupled to said second phase leg conductor, said second lead conductor having a second loop portion extending through said wall;
third insulation member disposed over said second lead conductor and extending from said third end to said second loop portion;
a fourth insulation member disposed over said second lead conductor extending from said fourth end to said second loop portion, wherein said third insulation member and said fourth insulation member define second gap therebetween; and,
a second cover movably coupled to said second lead conductor.

10. The meter device of claim 9 wherein said first cover and said second cover are electrical insulators.

11. The meter device of claim 10 further comprising:
a first coil disposed within said first gap; and,
a second coil disposed within said second gap.

12. The meter device of claim 11 wherein said first coil and said second coil are made from a copper.

13. The meter device of claim 11 wherein:
said first cover movable between a first position adjacent said first gap and a second position substantially covering said first gap; and,
said second cover movable between a third position adjacent said second gap and a fourth position substantially covering said first gap.

14. A method of checking a neutral conductor on an electrical meter having at least one phase conductor, said method comprising:
removing said electrical meter from a meter socket;
installing a meter adapter having at least one lead conductor electrically coupled to said at least one phase conductor and a neutral terminal;
installing said electrical meter on said meter adapter;
coupling an induction meter to said at least one lead conductor;
measuring a first measurement of electrical power with said induction meter;
coupling said neutral terminal to an external neutral;
measuring a second measurement of electrical power with said induction meter;
determining a deviation between said first measurement and said second measurement.

15. The method of claim 14 further comprising the step of confirming said neutral conductor has been severed.

16. The method of claim 15 further comprising the step of determining an error in the measurement by said electrical meter due to a severed neutral conductor.

17. The method of claim 15 herein said first measurement and said second measurement represents an amount of electrical power consumed during a time period.

18. The method of claim 14 wherein said first measurement and said second measurement are made for a period of time.

* * * * *